(12) United States Patent
Ahmed et al.

(10) Patent No.: US 11,431,348 B2
(45) Date of Patent: Aug. 30, 2022

(54) TWO-CAPACITOR DIGITAL-TO-ANALOG CONVERTER

(71) Applicant: SEMICONDUCTOR COMPONENTS INDUSTRIES, LLC, Phoenix, AZ (US)

(72) Inventors: Abdullah Ahmed, Ontario (CA); Akinobu Onishi, Ota (JP); Taichiro Kawai, Kiryu (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 17/248,840

(22) Filed: Feb. 10, 2021

(65) Prior Publication Data

US 2021/0266008 A1 Aug. 26, 2021

Related U.S. Application Data

(60) Provisional application No. 62/979,474, filed on Feb. 21, 2020, provisional application No. 62/979,472, filed on Feb. 21, 2020.

(51) Int. Cl.
*H03M 1/66* (2006.01)
*H03M 1/80* (2006.01)
*H03M 1/46* (2006.01)

(52) U.S. Cl.
CPC ........... *H03M 1/804* (2013.01); *H03M 1/468* (2013.01)

(58) Field of Classification Search
CPC ...... H03M 1/804; H03M 1/468; H03M 1/667; H03M 1/002; H03M 1/0617;
(Continued)

(56) References Cited

U.S. PATENT DOCUMENTS

| 4,584,568 A | 4/1986 | Zomorrodi |
| 4,709,225 A * | 11/1987 | Welland ............. H03M 1/1061 341/172 |

(Continued)

OTHER PUBLICATIONS

L. Weyten et al., "Two Capacitor DAC with compensative switching," Electronics Letters, Aug. 17, 1995, vol. 31, No. 17, pp. 1435-1437.

*Primary Examiner* — Linh V Nguyen
(74) *Attorney, Agent, or Firm* — Brake Hughes Bellermann LLP

(57) ABSTRACT

A two-capacitor digital-to-analog converter circuit having circuitry to compensate for an unwanted capacitance is disclosed. The converter is configured to generate an average voltage on two capacitors for a sequence of bits in a digital word so that when the final bit is reached, the average voltage corresponds to an analog level of the digital word. The converter is configured to input and average the voltage on the two capacitors using different modes to minimize the effects of capacitor mismatch and switching capacitance on the accuracy of the conversion. The converter includes a buffer amp that has an input capacitance that can affect the conversion. Accordingly, the converter further includes capacitance compensation circuitry configured to provide a replica input capacitance that can be charged and discharged according to the bits of the digital word and coupled to the input capacitor to prevent the input capacitance from affecting the conversion.

21 Claims, 9 Drawing Sheets

(58) Field of Classification Search
CPC ...... H03M 1/0697; H03M 1/162; H03M 1/66; H03M 1/806; H03M 1/0609; H03M 1/167; H03M 1/1038; H03M 1/1028; H03M 1/0612
USPC .......... 341/144, 150, 172, 118–120
See application file for complete search history.

(56) References Cited

U.S. PATENT DOCUMENTS

| | | | |
|---|---|---|---|
| 6,255,978 B1* | 7/2001 | Chang | H03M 1/664 |
| | | | 341/161 |
| 6,600,435 B2* | 7/2003 | Karube | H03M 1/66 |
| | | | 341/172 |
| 6,778,121 B2* | 8/2004 | Manganaro | H03M 1/804 |
| | | | 341/150 |
| 6,838,930 B2* | 1/2005 | Huynh | H03F 3/005 |
| | | | 330/69 |
| 7,425,913 B2 | 9/2008 | Wu et al. | |
| 8,284,089 B2* | 10/2012 | Guedon | H03M 1/0665 |
| | | | 341/150 |
| 2007/0216563 A1* | 9/2007 | Wu | H03M 1/667 |
| | | | 341/155 |
| 2008/0238748 A1* | 10/2008 | Wu | H03M 1/0617 |
| | | | 341/146 |
| 2014/0253355 A1 | 9/2014 | Quiqempoix | |
| 2021/0218411 A1* | 7/2021 | Alhoshany | H03M 1/1245 |

* cited by examiner

| MODE CONDITION | 0 → M1<br>1 → M2 | 0 → M2<br>1 → M1 | 0 → M1<br>1 → M2 | 0 → M2<br>1 → M1 | 0 → M1<br>1 → M2 |
|---|---|---|---|---|---|
| Data [4:0] | Data [4] | Data [3] | Data [2] | Data [1] | Data [0] |
| 00000 | Mode 1 | Mode 2 | Mode 1 | Mode 2 | Mode 1 |
| 00001 | Mode 1 | Mode 2 | Mode 1 | Mode 2 | Mode 2 |
| 00010 | Mode 1 | Mode 2 | Mode 1 | Mode 1 | Mode 1 |
| 00011 | Mode 1 | Mode 2 | Mode 1 | Mode 1 | Mode 2 |
| 00100 | Mode 1 | Mode 2 | Mode 2 | Mode 2 | Mode 1 |
| 00101 | Mode 1 | Mode 2 | Mode 2 | Mode 2 | Mode 2 |
| 00110 | Mode 1 | Mode 2 | Mode 2 | Mode 1 | Mode 1 |
| 00111 | Mode 1 | Mode 2 | Mode 2 | Mode 1 | Mode 2 |
| 01000 | Mode 1 | Mode 1 | Mode 1 | Mode 2 | Mode 1 |
| 01001 | Mode 1 | Mode 1 | Mode 1 | Mode 2 | Mode 2 |
| 01010 | Mode 1 | Mode 1 | Mode 1 | Mode 1 | Mode 1 |
| 01011 | Mode 1 | Mode 1 | Mode 1 | Mode 1 | Mode 2 |
| 01100 | Mode 1 | Mode 1 | Mode 2 | Mode 2 | Mode 1 |
| 01101 | Mode 1 | Mode 1 | Mode 2 | Mode 2 | Mode 2 |
| 01110 | Mode 1 | Mode 1 | Mode 2 | Mode 1 | Mode 1 |
| 01111 | Mode 1 | Mode 1 | Mode 2 | Mode 1 | Mode 2 |
| 10000 | Mode 2 | Mode 2 | Mode 1 | Mode 2 | Mode 1 |
| 10001 | Mode 2 | Mode 2 | Mode 1 | Mode 2 | Mode 2 |
| 10010 | Mode 2 | Mode 2 | Mode 1 | Mode 1 | Mode 1 |
| 10011 | Mode 2 | Mode 2 | Mode 1 | Mode 1 | Mode 2 |
| 10100 | Mode 2 | Mode 2 | Mode 2 | Mode 2 | Mode 1 |
| 10101 | Mode 2 | Mode 2 | Mode 2 | Mode 2 | Mode 2 |
| 10110 | Mode 2 | Mode 2 | Mode 2 | Mode 1 | Mode 1 |
| 10111 | Mode 2 | Mode 2 | Mode 2 | Mode 1 | Mode 2 |
| 11000 | Mode 2 | Mode 1 | Mode 1 | Mode 2 | Mode 1 |
| 11001 | Mode 2 | Mode 1 | Mode 1 | Mode 2 | Mode 2 |
| 11010 | Mode 2 | Mode 1 | Mode 1 | Mode 1 | Mode 1 |
| 11011 | Mode 2 | Mode 1 | Mode 1 | Mode 1 | Mode 2 |
| 11100 | Mode 2 | Mode 1 | Mode 2 | Mode 2 | Mode 1 |
| 11101 | Mode 2 | Mode 1 | Mode 2 | Mode 2 | Mode 2 |
| 11110 | Mode 2 | Mode 1 | Mode 2 | Mode 1 | Mode 1 |
| 11111 | Mode 2 | Mode 1 | Mode 2 | Mode 1 | Mode 2 |

MSB ← → LSB

FIG. 3

TWO-CAPACITOR DIGITAL-TO-ANALOG CONVERTER

CROSS-REFERENCE TO RELATED APPLICATION

This application claims the benefit of U.S. Provisional Application No. 62/979,472, filed on Feb. 21, 2020 and U.S. Provisional Application No. 62/979,474, filed on Feb. 21, 2020. The contents of these applications are hereby incorporated by reference, each in its entirety.

FIELD OF THE DISCLOSURE

The present disclosure relates to integrated analog and digital circuits and more specifically to a circuit for digital-to-analog conversion and method thereof.

BACKGROUND

Electronic systems may require a digital-to-analog converter (DAC) to transform a digital signal into a corresponding analog signal. For example, a DAC may allow for a digital word to set an output voltage level. In particular, the DAC may be configured to receive each binary bit ($b_0, b_1, \ldots b_{N-1}$) of a N-bit binary word and a reference voltage ($V_{REF}$) and to output an output voltage ($V_O$). In other words, the DAC can be configured to divide a range defined by the reference voltage into a plurality of levels, each corresponding to a possible digital word in a range of possible digital words for a given resolution. To accomplish this, the DAC may include a network of resistors or capacitors coupled by switches. The switches can be controlled ON/OFF by bits of a binary word in order to output voltages at various levels. Capacitor networks may be favored over resistor networks due to their lower loss but can be limited due to their large size and poor accuracy at high resolutions (N≥10). Accordingly, a DAC utilizing a capacitor network with improved size and accuracy is needed. It is in this context that implementations of the present disclosure arise.

SUMMARY

In at least one aspect, the present disclosure generally describes a two-capacitor digital-to-analog converter circuit (i.e., 2C-DAC). The 2C-DAC circuit includes a phase and mode controller that is configured to set an active bit in a digital word, select a mode condition for the active bit, and configure switching according to a first mode or a second mode of a conversion process based on a value of the active bit and the selected mode condition. The 2C-DAC circuit further includes a redistribution switch configured to, during an average phase of the conversion process, couple the first capacitor and the second capacitor together to generate an average voltage. The 2C-DAC circuit further includes a buffer amp that has an input capacitance at an input. The buffer amp is configured to generate an output voltage based on the average voltage. The 2C-DAC further includes a capacitance compensation circuit that includes a replica input capacitance. The capacitance compensation circuit is configured to couple a reference voltage or a ground to the replica input capacitance based on the value of the active bit during an input phase of the conversion process. The capacitance compensation circuit is further configured to couple the replica input capacitance to the input capacitance to adjust the average voltage, during the average phase of the conversion process.

In another aspect, the present disclosure generally describes a method for digital-to-analog conversion. The method includes receiving a digital word, setting an active bit of the digital word, selecting a mode condition for the active bit, and determining a first mode or a second mode for the active bit based on a value of the active bit and the selected mode condition. The method further includes executing an input phase that includes a first mode and a second mode. In a first mode of the input phase, a first capacitor and a replica input capacitance are charged or discharged according to the value of the active bit. In a second mode of the input phase, a second capacitor and a replica input capacitance are charged or discharged according to the value of the active bit. The method further includes executing an average phase that includes coupling the first capacitor and the second capacitor together to generate an average voltage for the active bit. The average phase further includes coupling the average voltage to a buffer amp having in input capacitance and coupling the replica input capacitance and an input capacitance together to generate an adjusted average voltage for the active bit at an input of the buffer amp.

In another aspect, the present disclosure generally describes a system for digital to analog conversion. The system includes a phase and mode controller configured to receive bits of a digital word and to output switching signals according to an input phase, an average phase, or an output phase of a conversion process and according to a first mode or a second mode, determined by each bit in the digital word received at an input to the system. The system further includes an average circuit that includes a first capacitor and a second capacitor. The averaging circuit is configured to charge or discharge the first capacitor or the second capacitor during an input phase and is configured to couple the first capacitor and the second capacitor together during an average phase in order to generate an average voltage. The system further includes an output circuit including an input capacitance. The output circuit is configured to generate an output voltage based on the average voltage received from the averaging circuit and is configured to couple the output voltage to an output of the system during the output phase. The system further includes a capacitance compensation circuit that includes a replica input capacitance that is substantially equal to the input capacitance. The capacitance compensation circuit is configured to couple the replica input capacitance and the input capacitance together during an average phase to adjust the average voltage to compensate for the input capacitance.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 3 is a table of possible mode conditions for each possible bit combination of a 5-bit binary word (i.e., digital word) according to an example implementation of the present disclosure.

The components in the drawings are not necessarily to scale relative to each other. Like reference numerals designate corresponding parts throughout the several views.

DETAILED DESCRIPTION

Figure 1A:
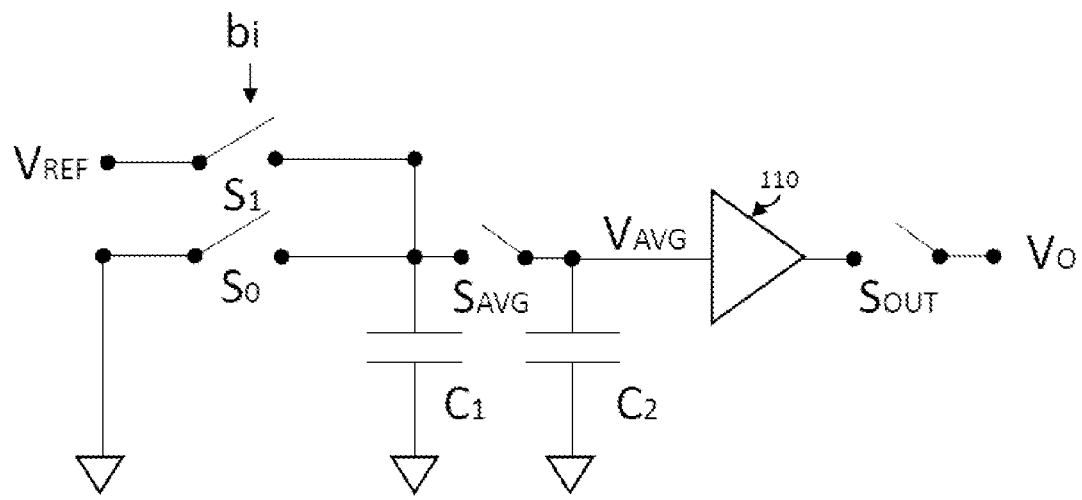
FIG. 1A is a schematic of an example two-capacitor DAC according to a possible implementation of the present disclosure.

The present disclosure describes a two-capacitor DAC that can provide high resolution conversion of low bandwidth signals with high accuracy. Compared with other capacitor network based DACs, such as the binary weighted capacitor network DAC or the ladder capacitor network (i.e., C-2C network) DAC, the disclosed DAC can be fabricated in smaller areas of an integrated circuit and does not require calibration for accurate performance at high resolutions. Additionally, the disclosed DAC offers alternative modes of operation and circuitry to compensate inaccuracies due to a practical implementation.

A binary weighted capacitor network DAC includes banks of capacitances (each bank having a particular capacitance) that can be coupled on/off to the reference voltage according to the binary input in order to generate a particular output voltage. One problem with this approach is the number of capacitors required for high resolution (N≥10) applications. The large number of capacitors may create networks that are too complex or too large for practical implementations. Additionally, problems that scale with the number of capacitors in the network, such as leakage, mismatch, etc. may also limit the resolution of a binary weighted capacitor that can be implemented practically. The disclosed DAC uses only two capacitors and thus, can be physically smaller than a corresponding binary weighted capacitor DAC. Additionally, the two capacitors may be nominally the same capacitance (e.g., 1:1 ratio); therefore, the range between the largest capacitor in the network and the smallest capacitor in the network (i.e., the capacitor spread) can be smaller. Further, capacitor mismatch can be effectively eliminated in the disclosed DAC because of a charge redistribution between the two capacitors in its network. Accordingly, the disclosed DAC can also have less capacitor mismatch than the binary weighted capacitor network and therefore can be more accurate (e.g., linear, monotonic).

A C-2C network DAC may be simpler and smaller than the binary-weighted capacitor network DAC but can still be complex and large in order to provide linear performance at high resolutions. The linearity of the C-2C network DAC can be affected by parasitic capacitances at nodes in the ladder network. To compensate for the parasitic capacitances, the C-2C DAC may require memory (e.g., RAM) for the storage and recall of digital correction terms (e.g., obtained through calibration) and/or may require a self-calibrating trim-capacitor array. In either case, the circuitry for compensating for parasitic effects can make the C-2C DAC more complex and larger. The disclosed DAC uses only two capacitors and thus, can be physically smaller than a corresponding C-2C network DAC. Further, nonlinearities due to parasitic capacitances can be effectively eliminated in the disclosed DAC because of a charge redistribution between the two capacitors in its network. Accordingly, the disclosed DAC may not require calibration or trim-capacitor arrays for linear performance at high-resolutions.

The advantages of the disclosed DAC capacitor network may come at the expense of its speed. For a binary weighted capacitor DAC or a C-2C DAC, the bits of a digital word may be applied to the capacitor network in parallel to obtain a corresponding output signal. In the disclosed DAC capacitor network, however, the bits of a digital word are applied in sequence (in series) and all bits, from the least significant bit (LSB) to the most significant bit (MSB), must be processed before the corresponding output signal can be obtained.

The trade-off between performance and speed may be acceptable for applications that do not require high-speed conversion. For example, some biomedical applications (e.g., glucose monitoring sensing) may require a DAC as part of a programmable bias circuit. These applications may require a DAC that is accurate and has low power consumption but may not require the DAC to have high speed. The disclosed DAC is well suited for these applications because it can operate at high resolution (e.g., ≥10 bit), has low power consumption, has a simple (i.e., small) layout, is highly linear (e.g., ≤±1 LSB for integral nonlinearity or differential nonlinearity), and can provide a rail-to-rail output.

To explain its ideal operation, a simplified two-capacitor DAC is shown in FIG. 1A. The capacitors ($C_1$, $C_2$) may be substantially the same capacitance so that a ratio of the capacitances may be approximately 1:1. For conversion, the two-capacitor DAC is configured to receive each bit ($b_1$) of a digital word (B), in sequence from the LSB to the MSB. An average voltage ($V_{AVG}$) can be generated for each bit in the sequence so that a final average voltage of the sequence is an output voltage ($V_O$) corresponding to an analog level of the digital word (B). The average voltage is a voltage generated by redistributing a charge difference between the capacitors charged to different voltages. When the redistribution is equal, the voltage on the capacitors after the redistribution is approximately an average of the voltage on each capacitor before the redistribution. It is in this context that the term "average" is used herein but the disclosure recognizes that variations could exists (e.g., if the redistribution is not equal). Accordingly, an average voltage (i.e., redistribution voltage) generated for each bit may refer generally to a voltage between (e.g., mid-range, offset mid-range, weighted average, etc.) the voltages on each capacitor before redistribution rather than a particular mathematical relationship. Each average voltage of the sequence is computed using two phases: an input phase and an average phase (i.e., redistribution phase). An output phase occurs after the final average voltage of the sequence is computed. A table of the switch states for each phase are shown in TABLE 1 below.

TABLE 1

EXAMPLE OF SWITCH STATES FOR
A SIMPLE TWO-CAPACITOR DAC

| PHASE | $S_0$ | $S_1$ | $S_{AVG}$ | $S_{OUT}$ |
| --- | --- | --- | --- | --- |
| INPUT ($b_i$ = 0) | ON | OFF | OFF | OFF |
| INPUT ($b_i$ = 1) | OFF | ON | OFF | OFF |
| AVERAGE | OFF | OFF | ON | OFF |
| OUTPUT | OFF | OFF | OFF | ON |

When the input bit ($b_1$) is a logical 1, then the high-bit input switch (i.e., the one switch ($S_1$)) may be configured to couple the first capacitor ($C_1$) to a reference voltage ($V_{REF}$) and when the input bit ($b_1$) is a logical 0, then a low-bit input switch (i.e., the zero switch ($S_0$)) may be configured to couple the first capacitor ($C_1$) to a ground voltage (e.g., 0V). The one switch ($S_1$) and the zero switch ($S_0$) are switched in complementary fashion so that when the one switch ($S_1$) is closed, the zero switch ($S_0$) is open, and vice versa. Based on the state of the switches, the first capacitor ($C_1$) is charged or discharged during the input phase of the DAC conversion process. In the average phase of the DAC conversion process, an average switch ($S_{AVG}$) (i.e., redistribution switch) is configured to couple the first capacitor ($C_1$) and the second capacitor ($C_2$) together so that the total stored charge in the capacitors is redistributed equally. The input phase and the average phase are repeated for each bit of the digital word before the output phase. In the output phase of the DAC conversion process, an output switch ($S_{OUT}$) is configured to couple the second a buffer amp 110 to an output of the DAC. The redistributed charge (i.e., average voltage) on the second capacitor ($C_2$) generates an input voltage at an input to the buffer amp 110, which is configured to generate an output voltage ($V_O$) at an output (i.e., the two-capacitor DAC output). The buffer amp may be a unity gain amplifier so that the average voltage ($V_{AVG}$) becomes the output voltage ($V_O$) of the two-capacitor DAC in the output phase.

Figure 1B:
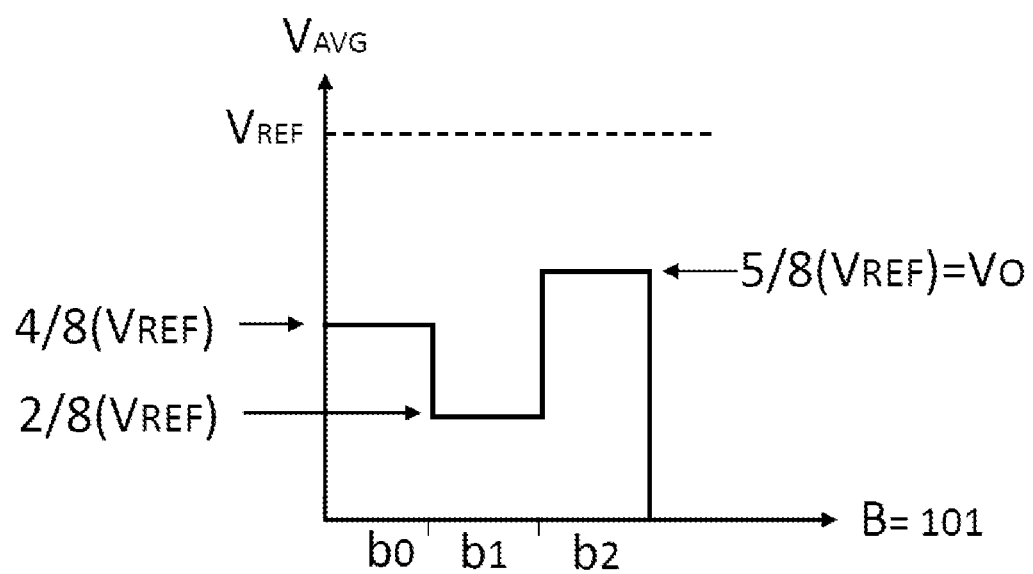
FIG. 1B is a graph of the output voltage of the two-capacitor DAC of FIG. 1A for a possible digital word.

FIG. 1B illustrates a graph of an output voltage ($V_{AVG}$) for the two-capacitor DAC shown in FIG. 1A is illustrated for the binary word, 101 (i.e., 5) in a range of binary words from 000 (i.e., 0) to 111 (i.e., 7). For the LSB (i.e., $b_0$), the first capacitor is charged to the reference voltage ($V_{REF}$) in the input phase. Next, the charge is then split equally between the capacitors in the average phase so that the average voltage ($V_{AVG}$) for $b_0$ is $V_{REF}/2$ (i.e., $4/8V_{REF}$). For the next significant bit ($b_1$), the first capacitor ($C_1$) is discharged to ground in the input phase. Next, the remaining charge is split equally between the capacitors in the average phase so that the average voltage ($V_{AVG}$) discharged to a voltage that is halfway between $V_{REF}/2$ and ground (i.e., $2/8V_{REF}$). For the most significant bit ($b_2$), the first capacitor ($C_1$) is charged to $V_{REF}$. Next, the charge is split equally between the capacitors in the average phase so that the average voltage ($V_{AVG}$) is charged to a voltage that is halfway between the previous output voltage and $V_{REF}$ (i.e., $5/8V_{REF}$). Accordingly, the average voltage progresses through the bits from the LSB to the MSB, ending on at an output voltage ($V_O$) that corresponds to the digital value. Thus, an entire digital word can be processed sequentially to arrive at the appropriate converted analog value.

The performance (e.g., accuracy) of the two-capacitor DAC may be characterized by its integral nonlinearity and its differential nonlinearity. Integral nonlinearity (INL) is a difference between an actual DAC output and an ideal DAC output for a digital input. Differential nonlinearity (DNL) is a difference between an actual step size and an ideal step size for a step between digital inputs (e.g., step between 000 and 001). In some applications, it is desirable for the INL and the DNL to be less than ±1 LSB. When these conditions are satisfied the DAC may be said to be monotonic. Besides capacitor mismatch, practical implementations of the two-capacitor DAC shown in FIG. 1A may have additional (i.e., unwanted) capacitances that can lead to a degradation in performance. Further, the additional capacitances can limit a rail-to-rail operation of the two-capacitor DAC. The disclosed two-capacitor DAC utilizes methods and circuitry to reduce or eliminate the additional capacitances to improve performance so that the two-capacitor DAC is monotonic and can operate rail-to-rail.

One source of additional capacitances results from practical implementation of the switches (e.g., $S_0$, $S_1$) used in the input phase. For example, the first switch ($S_1$) of the two-capacitor DAC shown in FIG. 1A may be implemented as a transistor (e.g., MOSFET) that includes a small capacitance (e.g., gate capacitance, $C_{GS}$) that is charged during operation. The charge stored in this small capacitance can change (e.g., reduce) the charge stored in the capacitor ($C_1$) during the input phase. For short binary words (e.g., N<10) the change in the charge may be relatively small so that at the conclusion of the sequence of binary bits, the final output voltage is not significantly altered from its ideal level. In other words, the performance is not significantly degraded. For long binary words (i.e., high resolutions), however, the cumulative effect of the charge change caused by the switching capacitance can degrade the performance of the two-capacitor DAC. The disclosed two-capacitor DAC utilizes methods and circuitry to mitigate the effects of switching capacitance in order to improve a performance.

Another source of additional capacitance in a practical implementation is the buffer amp 110. The buffer amp 110 can be implemented as an operational amplifier (i.e., opamp) having an input capacitance. For example, an input stage of the buffer amp (e.g., operational amplifier) may include a transistor (e.g., MOSFET) that has a capacitance associated with its operation (e.g., gate capacitance, $C_GS$). The input capacitance can alter (e.g., reduce) the level of the charge output from two capacitors. Accordingly, the output voltage ($V_O$) at an output of the two-capacitor DAC may be less accurate by a level corresponding to a determined ratio of the input capacitance of the buffer amp and the first capacitor $C_1$ and the second capacitor $C_2$. The accuracy of the two-capacitor DAC may vary according to a binary word input because the input capacitance can vary according to a voltage at the input of the buffer amp 110. The disclosed two-capacitor DAC utilizes methods and circuitry to mitigate the effects of the buffer amp input capacitance and its variations in order to improve a performance.

Figure 2:
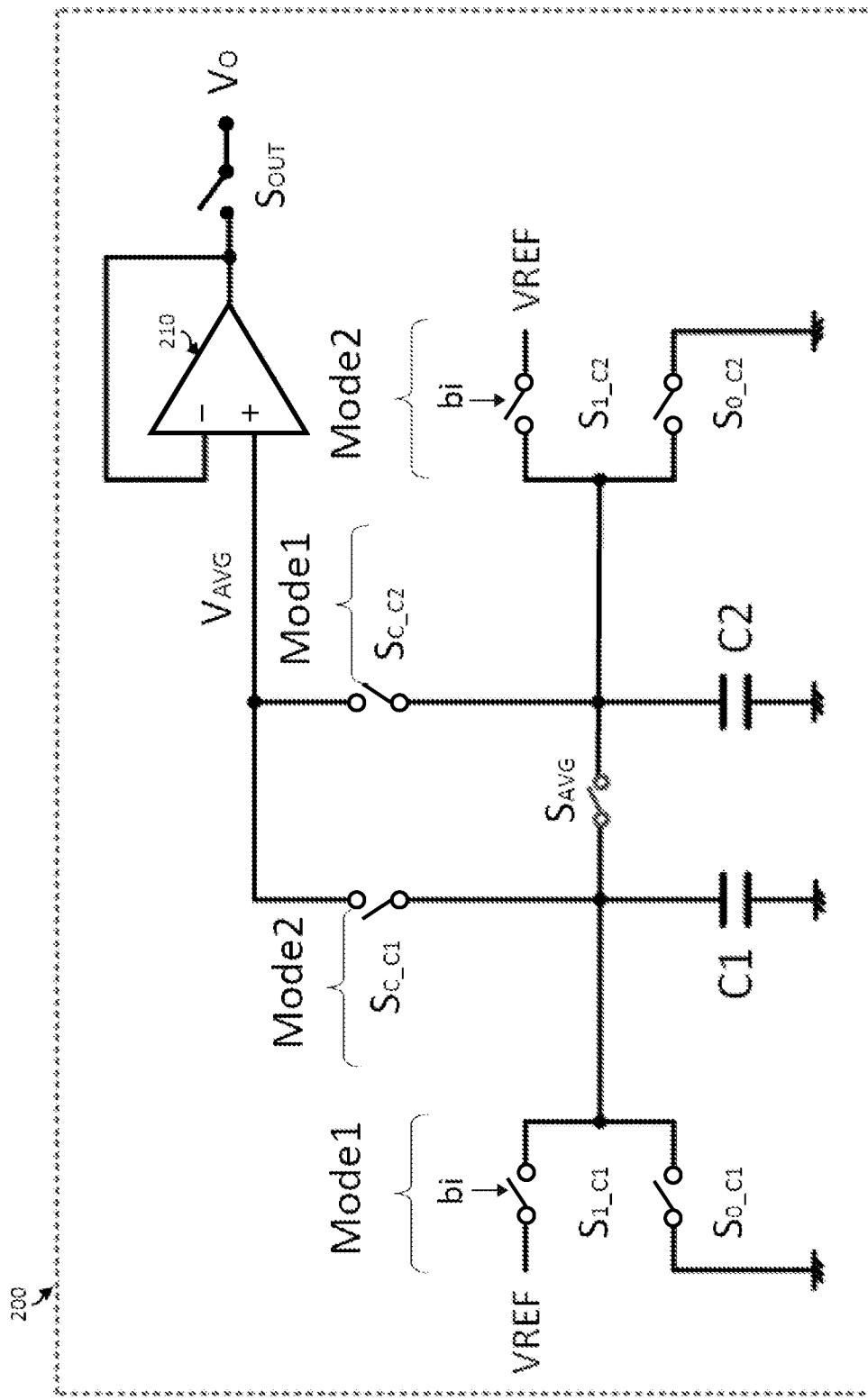
FIG. 2 is a schematic of a two-capacitor DAC (i.e., 2C-DAC) according to a first possible implementation of the present disclosure.

FIG. 2 is a schematic of a two-capacitor DAC (i.e., 2C-DAC) circuit according to a first possible implementation of the present disclosure. The 2C-DAC circuit 200 (i.e., circuit) includes a plurality of switches that configure the circuit for a digital conversion process. As described previously, the digital conversion of a binary (i.e., digital) word is carried out by computing an average voltage ($V_{AVG}$) for each bit. For example, a first average voltage may be computed based on a least significant bit of the binary word and then successively updated until all bits of the digital word have been processed (i.e., until the MSB). The final average voltage is at a level that corresponds to the digital word and is coupled to an output of the DAC as an output voltage ($V_O$). The average voltage obtained for each bit is computed using an input phase and an average phase. The 2C-DAC circuit is configured for each phase of the conversion process through the control of a plurality switches. The switches may be implemented as transistor devices (e.g., NMOS transistors and/or PMOS transistors).

The 2C-DAC includes a first set of input switches ($S_{1\_C1}$, $S_{0\_C1}$) that are configurable, in an input phase, to charge/discharge a first capacitor ($C_1$). The configuration of the switches is based on a bit of the binary word. For example, if the bit of the digital word is a 1, then switch, $S_{1\_C1}$, is ON (i.e., conducting) while switch, $S_{0\_C1}$, is OFF (i.e., not conducting), and vice versa when the current bit is a zero. The 2C-DAC further includes a second set of input switches ($S_{1\_C2}$, $S_{0\_C2}$) that are configurable, during an input phase, to charge/discharge the second capacitor. The configuration of the switches of the second set can also be based on the bit of the binary word. For example, if bit is a 1 then switch, $S_{1\_C2}$, is ON while switch, $S_{0\_C1}$, is OFF, and vice versa when the bit is a zero.

During the input phase, only one set of input switches is active for each bit of the digital word. For example, some bits of the digital word can be input using the first set of input switches ($S_{1\_C1}$, $S_{0\_C1}$) while other bits of the digital word can be input using the second set of input switches ($S_{1\_C2}$, $S_{0\_C2}$). The choice of the first set or the second set for the input phase is determined by a mode of the 2C-DAC circuit.

The 2C-DAC circuit may operate in one of two modes. In a first mode (i.e., Mode1) the first set of input switches ($S_{1\_C1}$, $S_{0\_C1}$) is used, while in a second mode (i.e., Mode2), the second set of input switches ($S_{1\_C2}$, $S_{0\_C2}$) is used. The 2C-DAC further includes a set of coupling switches ($S_{1\_C1}$, $S_{1\_C2}$) that are configurable, in the input phase, to coupled either the first capacitor ($C_1$) or the second capacitor ($C_2$) to a buffer amp 210. The choice of the first capacitor coupling switch ($S_{1\_C1}$) or the second capacitor coupling switch ($S_{1\_C2}$) can be determined by a mode of the conversion process. For example, in a first mode (i.e., Mode1) the first capacitor ($C_1$) can be charged in the input phase, while the second capacitor ($C_2$) can be coupled to the buffer amp 210 in the input phase. In a second mode (i.e., Mode2) the second capacitor ($C_2$) can be charged in the input phase, while the first capacitor ($C_1$) can be coupled to the buffer amp 210 in the input phase. Switching in this way alternates the capacitors charged/discharged during the input phase and coupled to the buffer amp 210 during the input phase. By alternating coupling in this way, the effects of capacitor mismatch may be reduced and a performance (e.g., accuracy, linearity) of the DAC conversion can be increased. TABLE 2 illustrates example switch states for an input phase according to a possible implementation of the present disclosure. Other switches not mentioned in TABLE 2 may be OFF in the input phase.

TABLE 2

EXAMPLE SWITCH STATES FOR AN INPUT PHASE

|  | bi = 1, MODE 1 | bi = 0, MODE1 | bi = 1, MODE2 | bi = 0, MODE2 |
| --- | --- | --- | --- | --- |
| $S_{1\_C1}$ | ON | OFF | OFF | OFF |
| $S_{0\_C1}$ | OFF | ON | OFF | OFF |
| $S_{1\_C2}$ | OFF | OFF | ON | OFF |
| $S_{0\_C2}$ | OFF | OFF | OFF | ON |
| $S_{C\_C1}$ | OFF | OFF | ON | ON |
| $S_{C\_C2}$ | ON | ON | OFF | OFF |

The 2C-DAC further includes an average switch (i.e., redistribution switch). After either the first capacitor ($C_1$) or the second capacitor ($C_2$) is charged/discharged during the input phase, an average phase may begin. In the average phase, the average switch, $S_{AVG}$, can be turned ON while the input switches may be turned OFF. The average switch may be used for the average phase regardless of the mode. When the average switch, $S_{AVG}$, is turned ON the charge in the first capacitor ($C_1$) and the second capacitor ($C_2$) can equalize to an average value. Accordingly, the voltage on each capacitor may be substantially the same (e.g., equal) at the conclusion of the average phase.

The set of coupling switches ($S_{1\_C1}$, $S_{1\_C2}$) are configurable, in the average phase, to couple both the first capacitor ($C_1$) and the second capacitor ($C_2$) to a buffer amp. For example, in a first mode (i.e., Mode1) the first capacitor ($C_1$) can be charged in the input phase, while the first capacitor ($C_1$) and the second capacitor ($C_2$) can be coupled together and to the buffer amp in the average phase. In a second mode (i.e., Mode2) the second capacitor ($C_2$) can be charged in the input phase, while the first capacitor ($C_1$) and the second capacitor ($C_2$) can be coupled together and to the buffer amp in the average phase. Switching in this way alternates the capacitors charged/discharged during the input phase and couples both capacitors to the buffer amp during the average phase. By switching in this way, the effects of capacitor mismatch may be reduced and a performance (e.g., accuracy, linearity) of the DAC conversion can be increased. TABLE 3 illustrates example switch states for an average phase according to a possible implementation of the present disclosure. Other switches not mentioned in TABLE 3 may be OFF in the average phase.

TABLE 3

EXAMPLE SWITCH STATES FOR AN AVERAGE PHASE

|  | MODE1 | MODE2 |
| --- | --- | --- |
| $S_{AVG}$ | ON | ON |
| $S_{C\_C1}$ | ON | ON |
| $S_{C\_C2}$ | ON | ON |

The 2C-DAC can further include the buffer amp 110 implemented as an operational amplifier 210 (i.e., opamp). The operational amplifier 210 may be configured for unity gain so that, in an output phase, the output voltage ($V_O$) may be approximately equal to an average voltage after the charge has been redistributed between the first capacitor and the second capacitor. The output voltage ($V_O$) of the operational amplifier can be a voltage in a range determined by an upper rail voltage and a lower rail voltage supplied to the operational amplifier. In a possible implementation, the operational amplifier may be configured for rail-to-rail operation so that the output voltage ($V_O$) can be in a range from a ground voltage to the reference voltage ($V_{REF}$).

By alternating modes during a conversion, the capacitor charged/discharged in the input phase can vary. This variation can minimize the effects of capacitor mismatch and unwanted capacitances (e.g., switching capacitances) from negatively affecting a precision of $V_O$ for a given bit. Accordingly, the disclosed 2C-DAC may have improved an improved accuracy. This improved accuracy may be especially important for high resolution (high bit depth) applications in which an output voltage range is subdivided into subranges to represent each possible bit combination in a digital word. For example, a rail-to-rail output voltage range of 0-5V must be divided into 32 subranges to represent a 5-bit digital word, which only provides a subrange of approximately 156 mV for each possible bit. As the number of bits of the digital word is increased, more accuracy is required. The disclosed 2C-DAC may provide an accuracy to handle high resolutions (N-bit words, N≥10).

Mode selection may be based on a mode condition for each bit of a digital word. For example, a mode condition may one of two possible mode conditions for each bit in a digital word. Mode conditions be rules, such as expressed in the equations below.

$$\text{mode\_condition\_1} = \begin{cases} \text{if } b_i = 0 \rightarrow mode1; \\ \text{if } b_i = 1 \rightarrow mode2 \end{cases} \quad (1)$$

$$\text{mode\_condition\_2} = \begin{cases} \text{if } b_i = 0 \rightarrow mode2; \\ \text{if } b_i = 1 \rightarrow mode1 \end{cases} \quad (2)$$

The mode condition may be based on a bit location in the digital word. For example, a LSB (i=0) may have the first mode condition, a next higher significant bit (i.e., i=1) may have the second mode condition, a next higher significant bit (i.e., i=2) may have the first mode condition, and so on until the MSB. Thus, as bits are clocked sequentially into the DAC, the mode condition may change (e.g., alternate) between the first mode condition (i.e., mode-condition_1) and the second mode condition (i.e., mode_condition_2).

FIG. 3 is a table of possible mode conditions and modes for each possible bit combination of a 5-bit binary word (i.e., digital word) according to an example implementation of the present disclosure. Each possible digital word has a unique combination of modes based on (i) the mode conditions for each bit position and (ii) the bit value for each bit position. For the digital word 00000, the mode used for each bit from the LSB to the MSB alternates because the mode condition alternates for each bit position while the bit value for each bit position does not. Likewise, for the digital word 11111, the mode used for each bit from the LSB to the MSB alternates because the mode condition alternates for each bit position while the bit value for each bit position does not. The modes used for the digital word 00000 and 11111 are complementary. For the digital word 01010, the mode used for each bit from LSB to MSB is the same (i.e., Mode1) because the mode condition alternates for each bit position and the bit value also alternates for each bit position. Likewise, for the digital word 10101, the mode used for each bit form the LSB to the MSB is the same (i.e., Mode2) because the mode condition alternates for each bit position and the bit value also alternates for each position. The choice of which mode condition to use for the LSB of the 00000 word can be either the first mode condition or the second mode condition as long as the mode condition alternates for each bit position (i.e., in a horizontal direction of the table).

The 2C-DAC includes circuitry (not shown) configured to sequentially feed bits (i.e., clock bits) of a digital word into the 2C-DAC, select a mode condition based on the significance of the bit (i.e., its bit position in the sequentially fed bits), and to select a mode (i.e., Mode1, Mode2) based on a value of the bit applied to the selected mode condition. For example, the 2C-DAC can include logic circuitry to activate the first mode (Mode1) or the second mode (Mode2) based on the table shown in FIG. 3. Alternatively, the 2C-DAC can include logic circuitry to activate the first mode (Mode1) or the second mode (Mode2) based on a table similar to that shown in FIG. 3 when there are greater than or fewer than 5 bits in a digital word.

The mode condition may be implemented using a bit select signal (i.e., Bit_Select). The bit select signal may alternate based on the significance of the bit. For example, the bit select signal may be zero for the LSB bit (Data[0]), one for the next significant bit (Data[1]), zero for the next significant bit (Data[2]), and so on until the MSB. A mode may be selected by comparing a value of the bit (i.e. Bit_Value) to the bit select signal. For example, Mode1 may be selected when the bit select signal is 0 and the value of the bit is 0, and Mode 2 may be selected when the bit select signal is 0 and the value of the bit is 1. Likewise, Mode 2 may be selected when the bit select signal is 1 and the value of the bit is 0, and Mode1 may be selected when the bit select signal is 1 and the value of the bit is 1.

Figure 4:
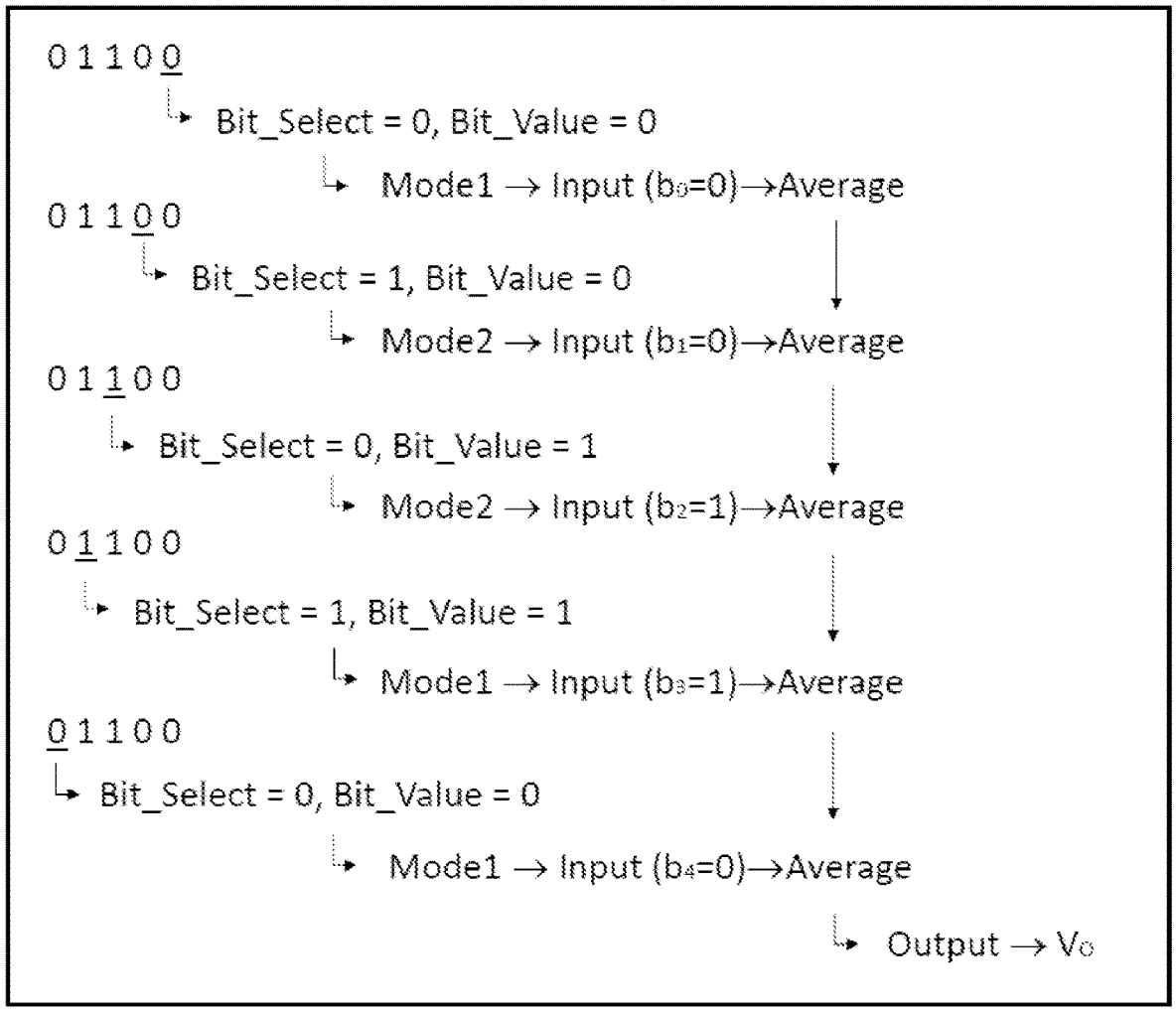
FIG. 4 graphically illustrates the process of mode condition selection and mode determination based on the table of possible mode conditions shown in FIG. 3.

FIG. 4 graphically illustrates the process of mode condition selection and mode determination based on the table of possible mode conditions shown in FIG. 3. The process is based on the example 5-bit digital word, 01100. The process begins with the LSB of the 5-bit digital word, 01100. From the table shown in FIG. 3, the mode condition used for the LSB (Data[0]) is the first mode condition (Bit_Select=0). Accordingly, when the bit value ($b_0$=0) of the LSB is applied to the mode condition, Mode1 is selected. In other words, the bit select signal for the bit (i.e., 0) matches the bit value (i.e., 0) so Mode1 is selected. As a result, the 2C-DAC shown in the FIG. 2 can proceed through the input, average, and output phases using the switches prescribed to Mode1.

The process continues with the next significant bit of the 5-bit digital word, 01100. From the table shown in FIG. 3 the mode condition used for the next significant bit (Data[1]) is the second mode condition (Bit_Select=1). Accordingly, when the bit value ($b_1$=0) of the next significant bit is applied to the mode condition, Mode2 is selected. In other words, the bit select signal for the bit (i.e., 1) does not match the bit value (i.e., 0) so Mode2 is selected. As a result, the 2C-DAC shown in the FIG. 2 can proceed through the input, average, and output phases using the switches prescribed to Mode2.

The process continues with the next significant bit of the 5-bit digital word, 01100. From the table shown in FIG. 3 the mode condition used for the next significant bit (Data[2]) is the first mode condition (Bit_Select=0)). Accordingly, when the bit value ($b_2$=1) of the next significant bit is applied to the mode condition, Mode2 is selected. In other words, the bit select signal (i.e., 0) does not match the bit value (i.e., 1) so Mode2 is selected. As a result, the 2C-DAC shown in the FIG. 2 can proceed through the input, average, and output phases using the switches prescribed to Mode2.

The process continues with the next significant bit of the 5-bit digital word, 01100. From the table shown in FIG. 3 the mode condition used for the next significant bit (Data[3]) is the second mode condition (Bit_Select=1). Accordingly, when the bit value ($b_3$=1) of the next significant bit is applied to the mode condition, Mode1 is selected. In other words, the bit select signal (i.e., 1) matches the bit value (i.e., 1) so Mode1 is selected. As a result, the 2C-DAC shown in the FIG. 2 can proceed through the input, average, and output phases using the switches prescribed to Mode1.

The process concludes with the MSB of the 5-bit digital word, 01100. From the table shown in FIG. 3 the mode condition used for the next significant bit (Data[4]) is the first mode condition (Bit_Select=0). Accordingly, when the bit value ($b_4$=0) of the MSB is applied to the mode condition, Mode1 is selected. In other words, the bit select signal (i.e., 0) matches the bit value (i.e., 0) so Mode 1 is selected. As a result, the 2C-DAC shown in the FIG. 2 can proceed through the input, average, and output phases using the switches prescribed to Mode1.

As can be observed the process changes modes when sequential bit values do not change. This can prevent a repeated charging of the same capacitor in sequence or a repeated discharging of the same capacitor in sequence. Preventing the repeated charging/discharging of the same capacitor in a bit sequence can prevent using the same switch repeatedly, which can prevent charging/discharging errors caused by a capacitance of the switch. On the other hand, the process does not change modes when sequential bit values change for at least the reason that different switches are used to charge and discharge the capacitor. By preventing the repeated charging/discharging of the same capacitor (i.e., the repeated use of the same switch), a performance (e.g., accuracy, linearity) of the DAC conversion can be increased.

At the conclusion of the process the output voltage ($V_O$) at the output of the buffer shown in FIG. 2 can be at a voltage that corresponds to the digital number 01100 (i.e., 12). For a 2C-DAC output voltage range of 0 V to 1 V. The output voltage ($V_O$) at the end of the process described can be 12/31 V. The process shown in FIG. 4 operates on binary words and can be repeated for additional binary words. For example, binary words may be input to the 2C-DAC in sequence to produce a time-varying output voltage. The rate at which the output voltage can vary may depend on a speed at which a process, such as shown in FIG. 4, can be carried out. Accordingly, higher resolutions (i.e., longer digital words) can result in slower conversions than lower resolution (i.e., shorter digital words).

Figure 5:
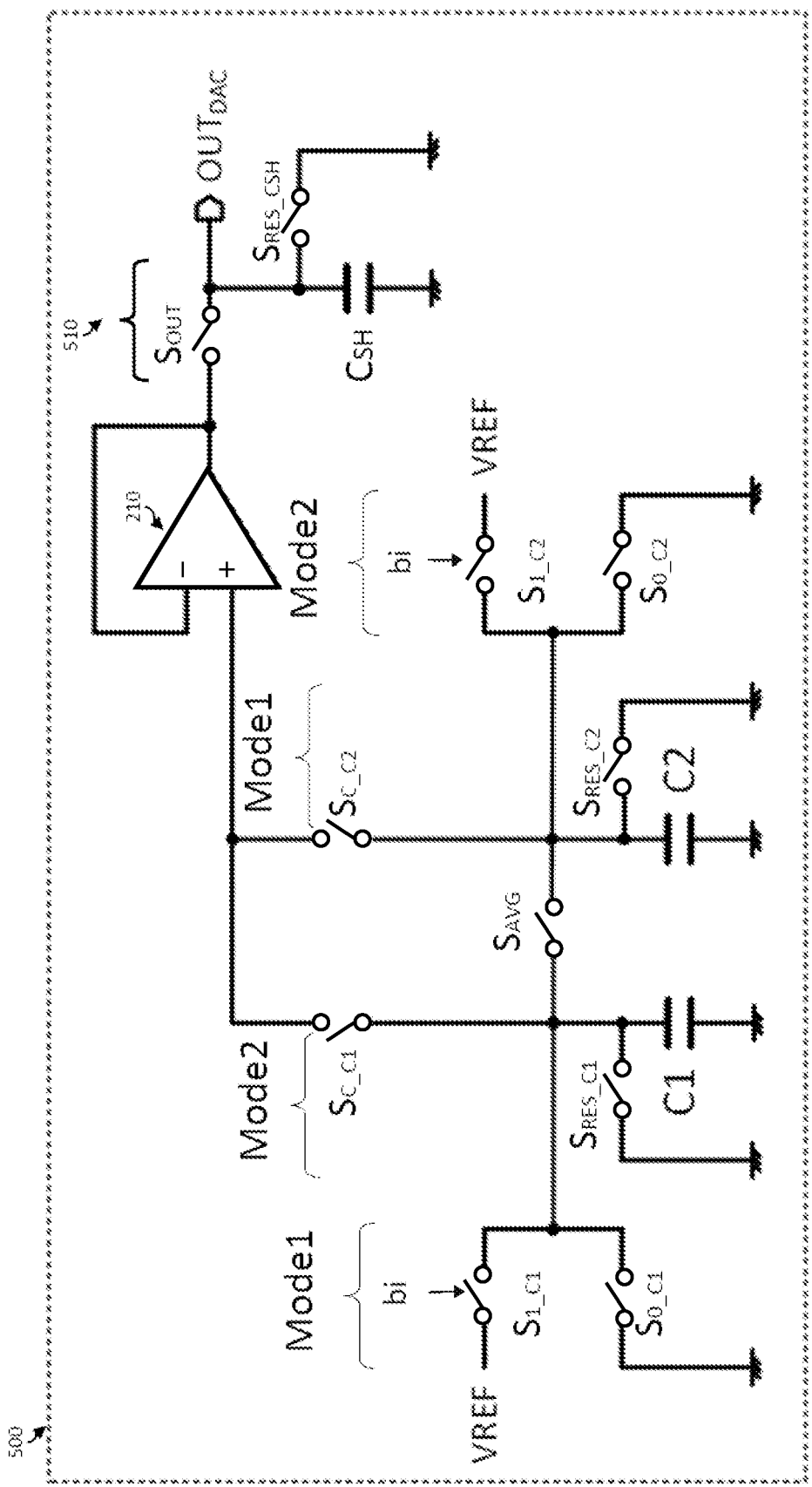
FIG. 5 is a schematic of a two-capacitor DAC (i.e., 2C-DAC) including reset and output circuitry according to a possible implementation of the present disclosure.

FIG. 5 is a schematic of a two-capacitor DAC (i.e., 2C-DAC) circuit including reset and output circuitry according to a possible implementation of the present disclosure. The 2C-DAC circuit 500 is similar to the implementation of FIG. 2 with the addition of a sample-and-hold circuit 510 at an output of the operational amplifier 210. The sample-and-hold circuit 510 includes a sample-and-hold capacitor ($C_{SH}$) coupled to the output switch ($S_{OUT}$). When the output switch is turned ON, the sample-and-hold capacitor ($C_{SH}$) is configured to be charged to the output voltage ($V_O$) of the operational amplifier 210. The sample-and-hold capacitor ($C_{SH}$) is coupled to an output of the DAC (i.e., $OUT_{DAC}$) so that even when the output switch ($S_{OUT}$) is turned OFF, the output voltage may be maintained at an output of the DAC (i.e., $OUT_{DAC}$) by the sample-and-hold capacitor ($C_{SH}$).

The 2C-DAC circuit 500 further includes reset switches coupled to each capacitor of the circuit. A first reset switch ($S_{RES\_C1}$) is coupled in parallel between a positive terminal of the first capacitor ($C_1$) and a ground. The first reset switch is configurable in an ON condition to discharge the first capacitor ($C_1$). A second reset switch ($S_{RES\_C2}$) is coupled in parallel between a positive terminal of the second capacitor ($C_2$) and the ground. The second reset switch is configurable in an ON condition to discharge the second capacitor ($C_2$). A sample-and-hold reset switch ($S_{RES\_CSH}$) is coupled in parallel between a positive terminal of the sample-and-hold capacitor ($C_{SH}$) and the ground. The sample-and-hold reset switch ($S_{RES\_CSH}$) is configurable in an ON condition to discharge the sample-and-hold capacitor ($C_{SH}$). The reset switches may be controlled together or individually. For example, the reset switches may be turned ON at the end of a digital word so no residual charge alters the computing of the next digital word.

The operational amplifier 210 of the 2C-DAC circuit 500 may have an input capacitance ($C_{IN}$) that can affect (e.g., reduce) the accuracy of the digital-to-analog conversion. For example, an input stage of the opamp may include a differential pair of transistors. One or more transistors in the differential pair may have a capacitance associated with a controlling terminal (e.g., gate terminal). In this example, the input capacitance ($C_{IN}$) of the opamp may be the capacitance associated with the gate terminal (i.e., $C_{GS}$). If the input capacitance of the opamp is charged using a portion of the charge coupled from the capacitor ($C_1$, $C_2$) then $V_O$ may have an error associated with this portion of the charge used to charge the input capacitance of the opamp. Calibration of this portion may be difficult, or impossible, because the input capacitance may vary.

Figure 6:
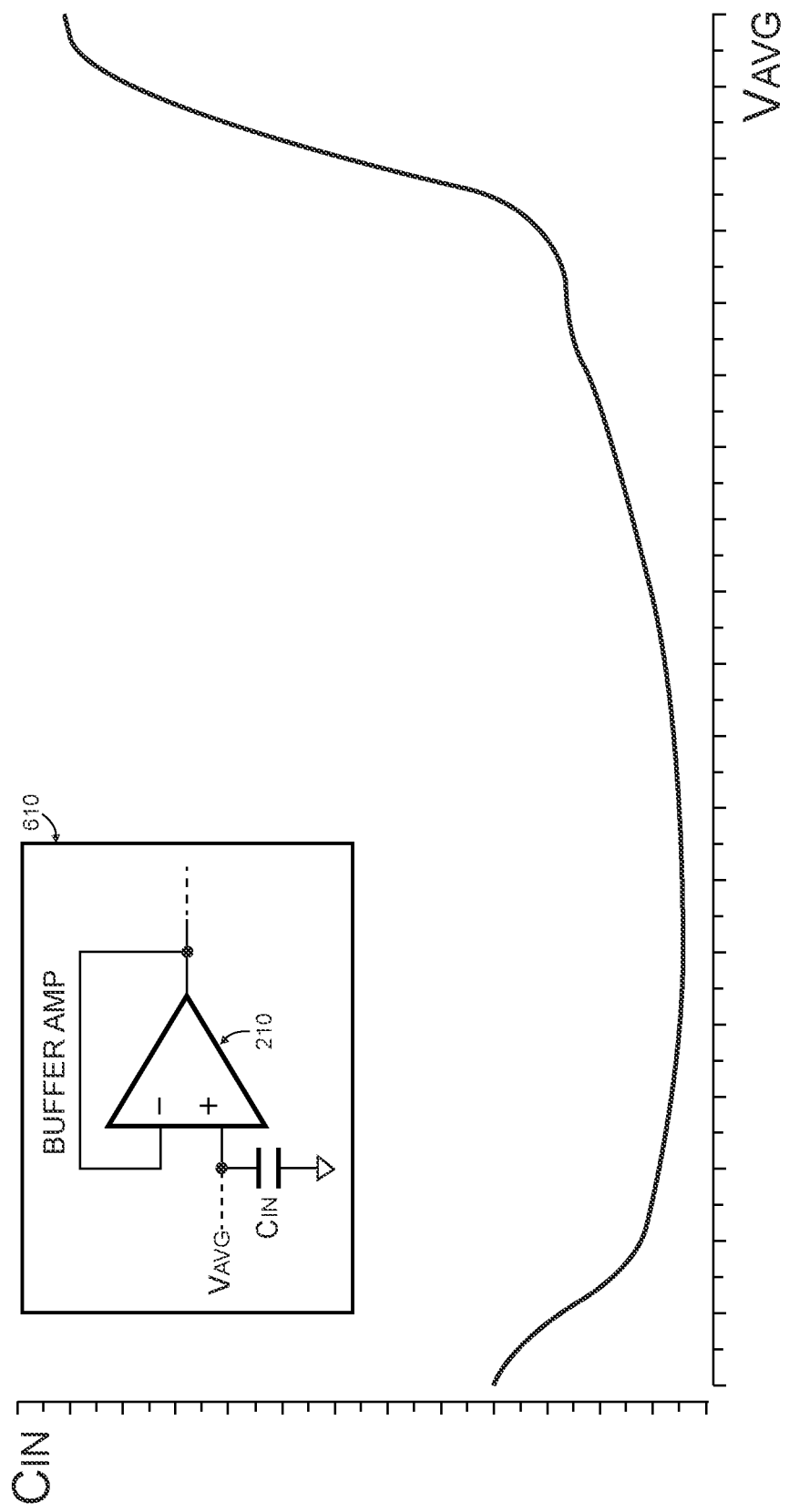
FIG. 6 is a graph of an input capacitance of a buffer amp versus averaged voltage according to a possible implementation of the present disclosure.

FIG. 6 is a graph of the input capacitance of an opamp configured as a buffer amp. The graph includes an inset 610 illustrating a buffer amp including an operational amplifier 210 that has an input capacitance $C_{IN}$. As shown in the graph, the input capacitance can vary an average input voltage ($V_{AVG}$) in a way that is complex (e.g., nonlinear, nonmonotonic, etc.). As described previously, during conversion, the average voltage may vary (e.g., see FIG. 1B). Accordingly, conversion errors resulting from the input capacitance can change for each possible bit combination. This can result is a conversion of a binary word having an error that that is difficult to predict. The disclosed two-capacitor DAC utilizes methods and circuitry to mitigate the effects of the buffer amp input capacitance and its variations in order to improve a performance (e.g., linearity, monotonicity, accuracy).

Figure 7:
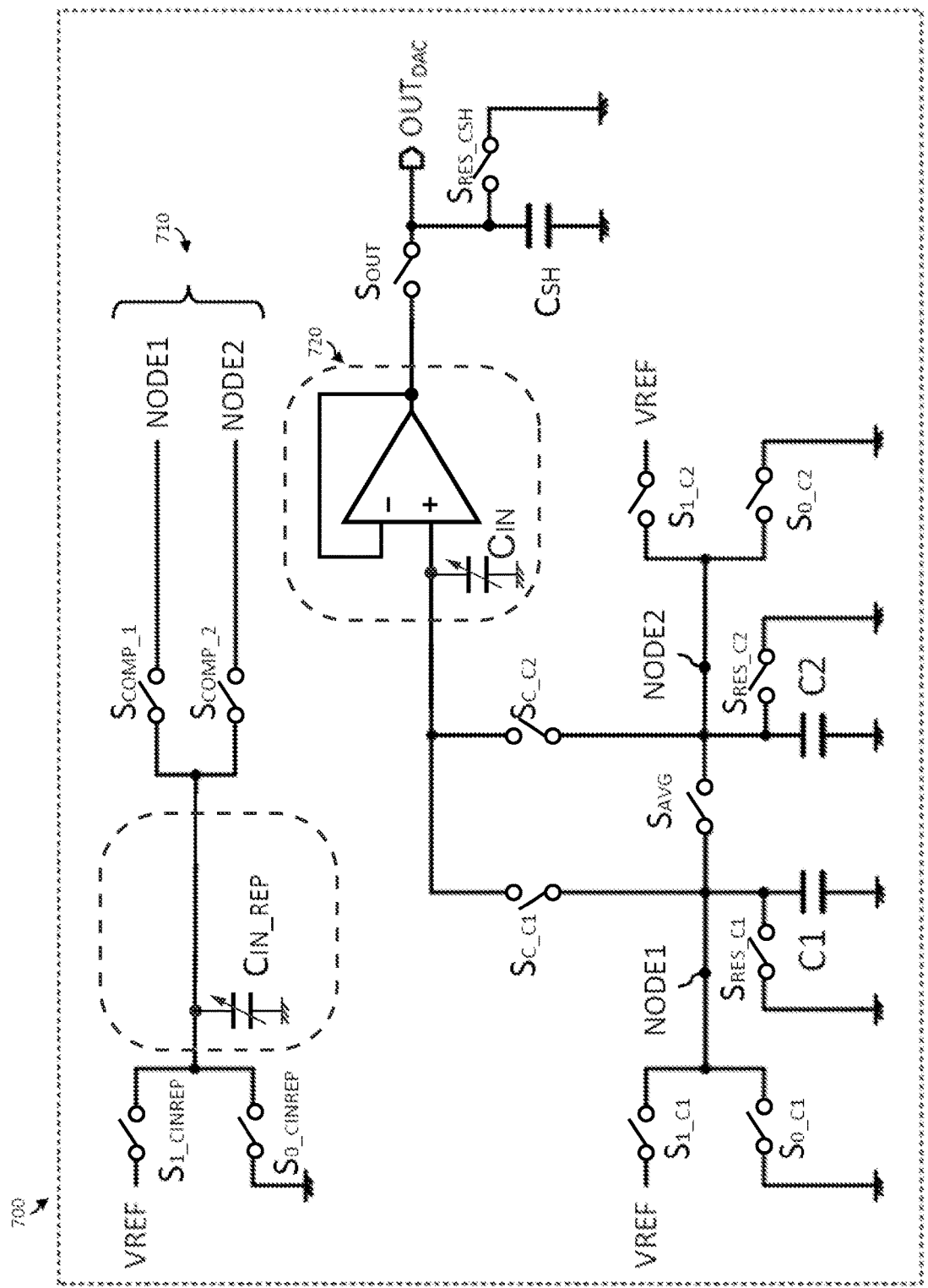
FIG. 7 is a schematic of a two-capacitor DAC (i.e., 2C-DAC) including input capacitance compensation according to a possible implementation of the present disclosure.

FIG. 7 is a schematic of a two-capacitor DAC (i.e., 2C-DAC) circuit including a capacitance compensation circuit according to a possible implementation of the present disclosure. The 2C-DAC circuit 700 is similar to the 2C-DAC implementation of FIG. 5 with the addition of a capacitance compensation circuit 710. The capacitance compensation circuit 710 includes a replica input capacitor ($C_{IN\_REP}$) (i.e., replica input capacitance) that has a similar capacitance (e.g., equivalent capacitance) to the input capacitor ($C_{IN}$) of the opamp 720. For example, the input capacitor ($C_{IN}$) and the replica input capacitor ($C_{IN\_REP}$) can have the same variation with average voltage (e.g., see FIG. 6).

The capacitance compensation circuit 710 can further include a pair of compensation-input switches ($S_1$, $S_0$). The compensation-input switches may be configured to operate according to the data controlling first set of input switches ($S_{1\_C1}$, $S_{0\_C1}$) or the second set of input switches ($S_{1\_C2}$, $S_{0\_C2}$). For example, a first compensation-input switch ($S_{1\_CINREP}$) may be turned ON when either $S_{1\_C1}$ or $S_{1\_C2}$ is turned ON, and a second compensation-input switch ($S_{0\_CINREP}$) may be turned ON when either $S_{0\_C1}$ or $S_{0\_C2}$ is turned ON. When the first compensation-input switch ($S_{1\_CINREP}$) is ON, the second compensation-input switch ($S_{0\_CINREP}$) may be OFF, and vice versa. In other words, in an input phase of either Mode1 or Mode2, the first compensation input switch ($S_{1\_CINREP}$) is turned ON when a bit value is a 1 or the second compensation input switch ($S_{2\_CINREP}$) is turned ON when the bit value is a zero. In this way, the replica input capacitor ($C_{IN\_REP}$) can be charged or discharged in an input phase.

The capacitance compensation circuit 710 can further include a first compensation switch ($S_{COMP\_C1}$) and a second compensation switch ($S_{COMP\_C2}$) that are configured to operate during the average phase and according to the modes. Accordingly, either $S_{COMP\_1}$ or $S_{COMP\_2}$ can be turned ON while the average switch ($S_{AVG}$) and $S_{C\_C1}$ or $S_{C\_C2}$ is turned ON. For example, in an average phase of a conversion process in Mode1, the first compensation switch ($S_{COMP\_1}$) may be turned ON to couple the charge stored in $C_{IN\_REP}$ to NODE1 of the 2C-DAC circuit 700. In an average phase of a conversion process in Mode2, the second compensation switch ($S_{COMP\_2}$) may be turned ON to couple the charge stored in $C_{IN\_REP}$ to NODE2 of the 2C-DAC circuit 700. The average phase of the conversion process thus has two aspects. A first aspect (i.e., a conversion-average) includes redistributing charge between $C_1$ and $C_2$ and a second aspect (i.e., replica-average) includes redistributing charge between $C_{IN\_REP}$ and $C_{IN}$.

In the average phase of the conversion processes (i.e., the replica-average), the charge on $C_{IN\_REP}$ may be redistributed with the input capacitance $C_{IN}$ in the same way that the charge on $C_1$ ($C_2$) can be redistributed with $C_2$ ($C_1$). Accordingly, a portion of charge is added to compensate for the charge consumed by the input capacitance. The replica input capacitor ($C_{IN\_REP}$) and the input capacitor ($C_{IN}$) have the same average voltage and the same average capacitance. In a possible implementation the replica input capacitor is a replica of a portion of the opamp 720 (not shown). For example, the capacitance compensation circuit 710 can include a transistor configured to substantially match a transistor of the opamp 720 coupled to the output of the 2C-DAC. TABLE 4 illustrates example switch states for an average phase according to a possible implementation of the present disclosure. Other switches not mentioned in TABLE 4 may be OFF in the average phase.

TABLE 4

EXAMPLE SWITCH STATES FOR AN AVERAGE PHASE

|  | MODE1 | MODE2 |
| --- | --- | --- |
| $S_{AVG}$ | ON | ON |
| $S_{C\_C1}$ | ON | ON |
| $S_{C\_C2}$ | ON | ON |
| $S_{COMP\_1}$ | ON | OFF |
| $S_{COMP\_2}$ | OFF | ON |

Figure 8:
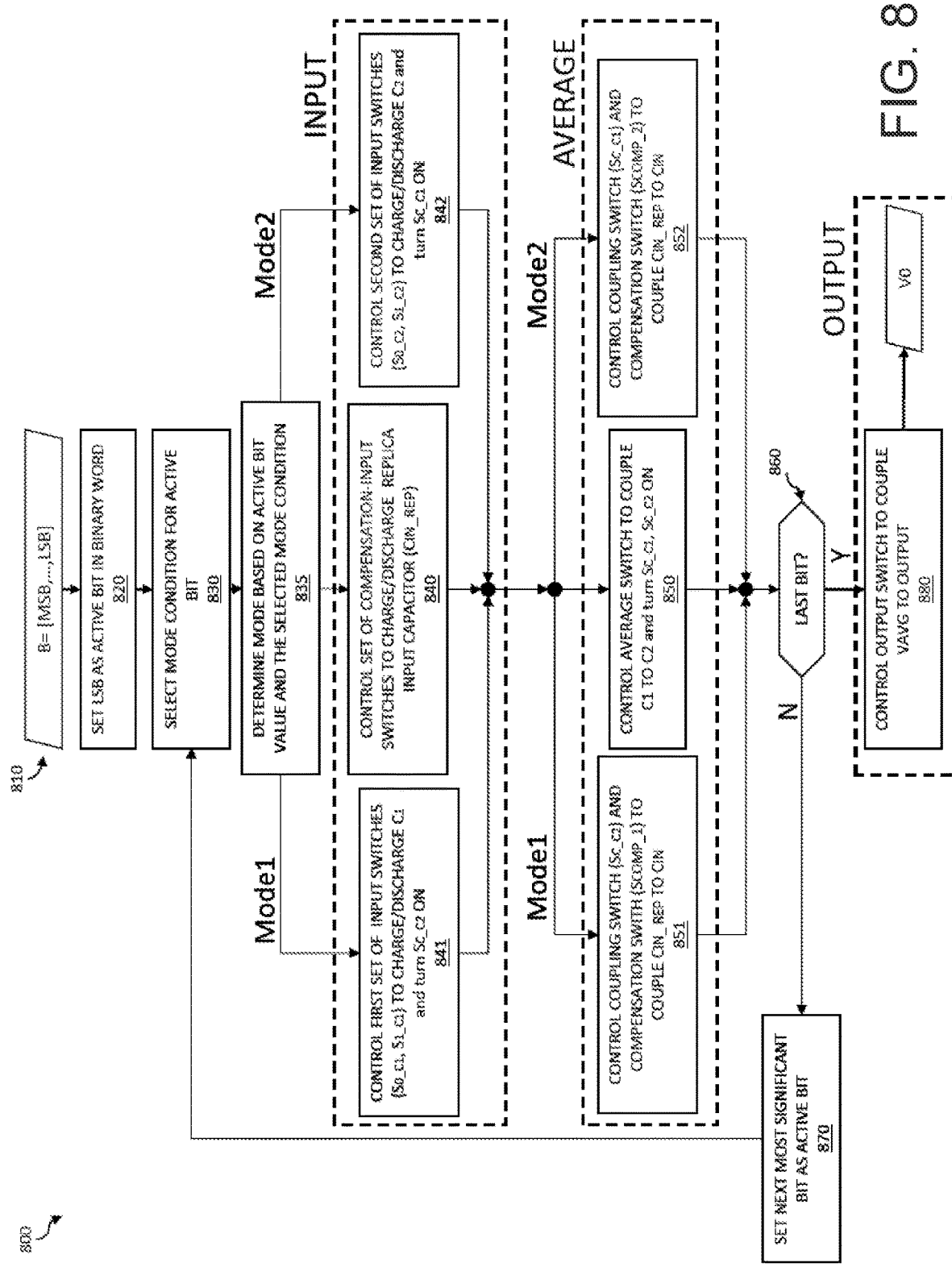
FIG. 8 is a flow chart of a method for digital to analog conversion according to a possible implementation of the present disclosure.

FIG. 8 is a flow chart of a method for digital to analog conversion according to a possible implementation of the present disclosure. The method 800 includes receiving 810 a binary word (B) (i.e., digital word) that include binary bits (i.e., digital bits, bits). For example, receiving the binary word may include receiving, in sequence, bits from the least significant bit (LSB) to the most significant bit (MSB). Accordingly, the method includes setting 820 the LSB as an active bit in the binary word. The method further includes selecting 830 a mode condition (e.g., 0=Mode1, 1=Mode2) based on the active bit in the binary word. The method then includes determining 835 a mode based on the value (e.g., 0, 1) of the active bit and the selected mode condition. The method then enters the input phase of the conversion process.

The converter may include a phase and mode controller to load the data into the converter, determine the mode for each bit and to output switching signals to the switches in the 2C-DAC circuit. For example, the phase and mode controller may include a shift register to sequentially feed bits into the 2C-DAC circuit. The phase and mode controller may further include logic configured to determine the mode condition and mode for each bit. The logic may be further configured to output switching signals based on the mode condition and mode for each bit.

In the input phase of the conversion process, the method includes controlling a set of input switches to charge or discharge a capacitor. In Mode1, the method includes controlling 841 the first set of input switches ($S_{0\_C1}$, $S_{1\_C1}$) to charge/discharge the first capacitor ($C_1$) (and turning $S_{C\_C2}$ ON). In Mode2, the method includes controlling 842 the second set of input switches ($S_{0\_C2}$, $S_{1\_C2}$) to charge/discharge the second capacitor ($C_2$) (and turning $S_{C\_C1}$ ON). Also, in the input phase, the method includes controlling 840 a set of compensation-input switches ($S_{1\_CINREP}$, $S_{0\_CINREP}$) to charge/discharge a replica input capacitor ($C_{IN\_REP}$). The control of the compensation-input switches can be independent of the mode. For example, when $b_1=1$ then $S_{1\_CINREP}$ may be turned ON to charge $C_{IN\_REP}$, while when $b_1=0$, then $S_{0\_CINREP}$ may be turned ON to discharge $C_{IN\_REP}$, regardless of the determined mode. After the input phase, the method enters the average phase of the conversion process.

In the average phase of the conversion process, the method includes controlling 850 the average switch ($S_{AVG}$) to couple $C_1$ to $C_2$ to redistribute (i.e., average) the charge between the capacitors (and turn $S_{C\_C1}$ and $S_{C\_C2}$ ON). The method further includes controlling switches to redistribute charge between the replica input capacitance ($C_{IN\_REP}$) and the input capacitance ($C_{IN}$) of a buffer amp to generate an adjusted average voltage. In Mode1 the method includes controlling 851 coupling switch ($S_{1\_C1}$) and coupling switch ($S_{1\_C2}$) and compensation switch ($S_{COMP\_1}$) to couple $C_{IN\_REP}$ to $C_{IN}$. In Mode2, the method includes controlling 852 coupling switch ($S_{1\_C1}$) and coupling switch ($S_{1\_C2}$) and compensation switch ($S_{COMP\_2}$) to couple $C_{IN\_REP}$ to $C_{IN}$.

After the average phase, the method can repeat the input phase and the average phase or enter an output phase based on the bit position of the active bit. Accordingly, the method includes checking 860 if the active bit is the final bit (e.g., the MSB) of the digital word. If the active bit is not the last bit of the digital word, then the next most significant bit is set 870 as the active bit and the process conversion process repeats for the new active bit. If the active bit is the last bit of the digital word, then the method enters the output phase.

In the output phase of the conversion process, the method includes controlling 880 an output switch ($S_{OUT}$) to couple the output of the buffer amp to the output of the DAC (i.e., $OUT_{DAC}$). The output voltage ($V_O$) of the buffer amp is a buffered version of the average voltage ($V_{AVG}$) at the input of the buffer amp. After the output is generated for a digital word, the first capacitor, the second capacitor, and the replica input capacitance can be discharged, and a new digital word can be received. After receiving the new digital word, the process described above may be repeated to obtain an output voltage for the new digital word.

Figure 9:
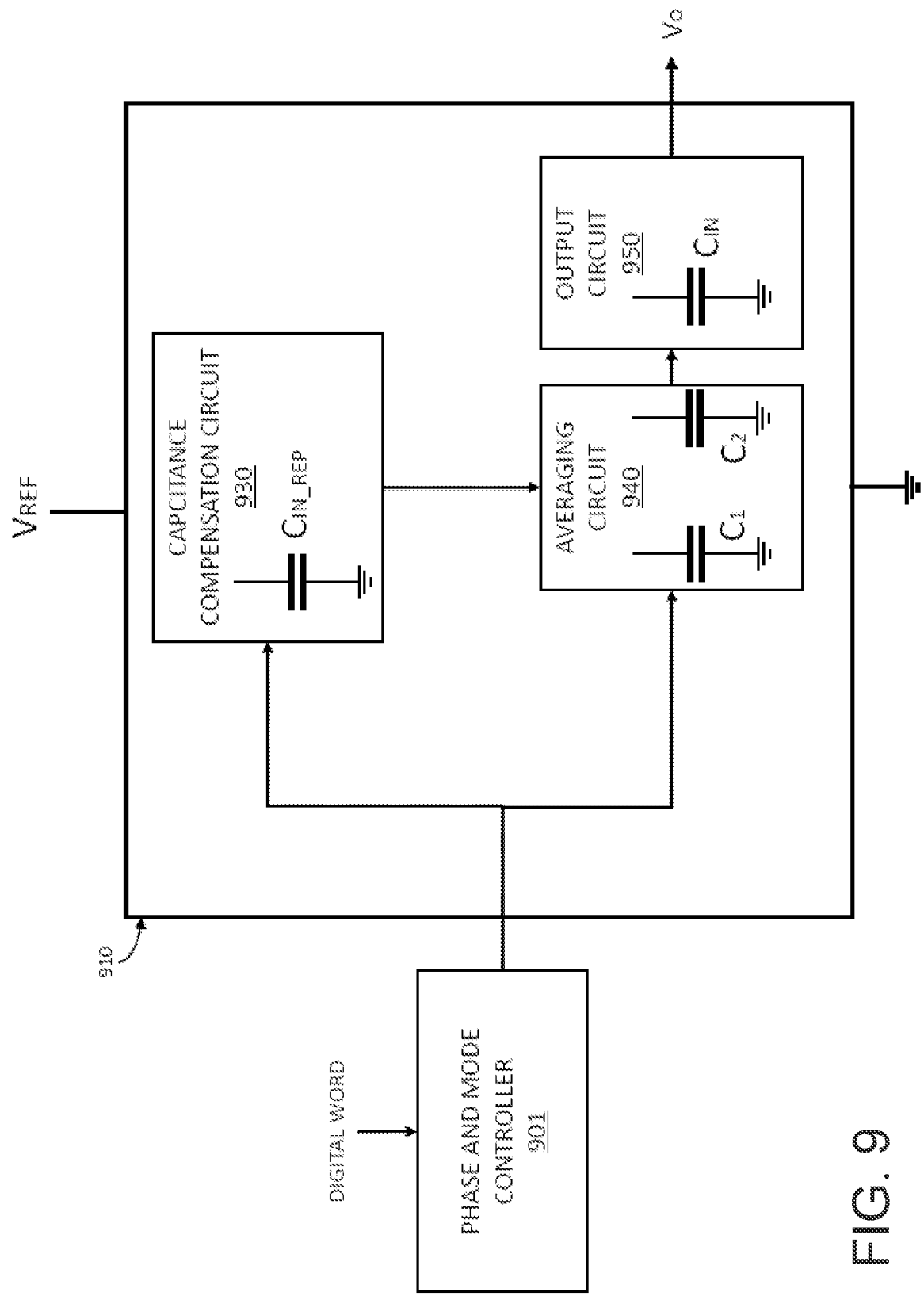
FIG. 9 is a block diagram of a system for digital to analog conversion according to an implementation of the present disclosure.

FIG. 9 is a block diagram of a system for digital to analog conversion according to an implementation of the present disclosure. The system includes a 2C-DAC 910 that can be configured by a phase and mode controller 901 in mode1 or mode2 versions of an input phase, an average phase, and an output phase. For example, the phase and mode controller 901 may include a digital shift register to read (i.e., clock-in) bit values of the digital word from least significant bit to most significant bit. The phase and mode controller 901 may further include logic configured to determine a mode condition and a mode (i.e., mode1, mode2) based on the position of the bit and the value of the bit (e.g., see FIG. 3). The phase and mode controller 901 may output switching signals coupled to switches in the 2C-DAC. The switches may be configured according to a mode (i.e., mode1, mode2) and a phase of the conversion (i.e., input, average, output).

The 2C-DAC can also include an averaging circuit 940. The averaging circuit 940 can include a first capacitor ($C_1$) and a second capacitor ($C_2$). The averaging circuit 940 can be configured by the switching signals to charge or discharge the first capacitor or the second capacitor during an input phase. The averaging circuit 940 may be further configured by the switching signals to couple the first capacitor and the second capacitor together during an average phase to average (i.e., redistribute) the added or remaining charge during an average phase. The averaging circuit 940 may be further configured to couple either the first capacitor ($C_1$) (e.g., for mode2) or the second capacitor ($C_2$) (e.g., for mode1) to an output circuit 950 during the average phase.

The 2C-DAC further includes an output circuit 950 that is coupled to an output of the 2C-DAC 910 during an output phase. The output circuit 950 may include a buffer amp to buffer an average voltage received from the averaging circuit 940 to generate an output voltage ($V_O$) of the 2C-DAC. The output circuit may have an input capacitance ($C_{IN}$) that can prevent a portion of charge (i.e., voltage) from reaching the output, with the portion being based on the average voltage at the input.

To compensate for the effect of $C_{IN}$ on the output voltage ($V_O$), the 2C-DAC 910 includes a capacitance compensation circuit 930. The capacitance compensation circuit includes a replica input capacitance ($C_{IN\_REP}$). The replica input capacitance can be a replica (i.e., copy) of the input capacitance ($C_{IN}$) of the buffer amp with the same variation with input voltage. The capacitance compensation circuit 930 may be configured by switching signal to charge or discharge the replica input capacitance during the input phase. The capacitance compensation circuit may be further configured to couple the replica input capacitance to the input capacitance during the average phase to average the added or remaining charge during an average phase so that the effects of the input capacitance on the output voltage ($V_O$) are compensated.

The disclosed 2C-DAC circuit may offer advantages over digital to analog conversion circuits. For example, it can be low power due to its need for only two capacitors for the conversion process. It can be high precision due, at least, to its compensation for switching capacitances, capacitor mismatches, and input capacitances that could otherwise affect an accuracy of the conversion process. It can occupy a small area in a silicon integrated circuit. For example, a 2C-DAC circuit using 4 picofarad (pF) or 8 pF capacitors and switches may require an area of 50 micrometers (m) by 70 m. The design time is expected to be minimized as the custom layout required is only for the two capacitors, the switches, the buffer amplifier, and the output capacitor. The rest of the design is in digital domain. While the conversion process has a latency associated with processing each bit in series, this latency may be suitable for applications that do not require speed and which may require rail-to-rail conversion of high precision. For example, biomedical application may have slowly varying conditions, which could be handled by the disclosed 2C-DAC.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC), Silicon-on-Insulator (SOI), Fully Depleted SOI (FDSOI) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A two-capacitor digital-to-analog converter circuit, comprising:
   a phase and mode controller configured to set an active bit in a digital word, select a mode condition for the active bit, and configure switches according to a first mode or a second mode of a conversion process based on a value of the active bit and the selected mode condition;
   a first capacitor directly coupled between a first terminal of a redistribution switch and a ground, the first terminal of the redistribution switch coupled to a first set of switches controlled by the phase and mode controller;
   a second capacitor directly coupled between a second terminal of the redistribution switch and the ground, the second terminal of the redistribution switch coupled to a second set switches controlled by the phase and mode controller, wherein the redistribution switch is configured to, during a redistribution phase of the conversion process, couple the first capacitor and the second capacitor together to generate a redistribution voltage;
   a buffer amp configured to generate an output voltage based on the redistribution voltage, the buffer amp having an input capacitance at an input; and
   a capacitance compensation circuit including a replica input capacitance, the capacitance compensation circuit configured to:
      couple, during an input phase of the conversion process, a reference voltage or a ground to the replica input capacitance based on the value of the active bit, and
      couple, during the redistribution phase of the conversion process, the replica input capacitance to the input capacitance to adjust the redistribution voltage.

2. The two-capacitor digital-to-analog converter circuit according to claim 1, further including:
   the first set of input switches are configured to, during an input phase of the conversion process in the first mode, to couple a first capacitor to a reference voltage or a ground based on the value of the active bit; and
   the second set of input switches are configured to, during the input phase of the conversion process in the second mode, couple a second capacitor to the reference voltage or the ground based on the value of the active bit.

3. The two-capacitor digital-to-analog converter circuit according to claim 1, further including:
   an output switch configured to, during an output phase of the conversion process, couple the output voltage to an output of the two-capacitor digital-to-analog converter circuit.

4. The two-capacitor digital-to-analog converter circuit according to claim 1, wherein the replica input capacitance is coupled to the input capacitance to adjust the redistribution voltage in order to reduce an effect of the input capacitance on the output voltage.

5. The two-capacitor digital-to-analog converter circuit according to claim 1, wherein the capacitance compensation circuit includes:
   a first compensation-input switch configured to couple, during the input phase of the conversion process in the first mode or the second mode, the replica input capacitance to a reference voltage when the value of the active bit is a one; and
   a second compensation-input switch configure to couple, during the input phase of the conversion process in the first mode or the second mode, the replica input capacitance to a ground when the value of the active bit is a zero.

6. The two-capacitor digital-to-analog converter circuit according to claim 5, wherein the capacitance compensation circuit includes:
   a first compensation switch configured to, during the redistribution phase of the conversion process in the first mode, couple the replica input capacitance to a positive terminal of the first capacitor; and
   a second compensation switch configured to, during the redistribution phase of the conversion process in the second mode, couple the replica input capacitance to a positive terminal of the second capacitor.

7. The two-capacitor digital-to-analog converter circuit according to claim 6, further including:
   a first capacitor coupling switch configured to, during the input phase of the conversion process in the second mode, couple the positive terminal of the first capacitor to the input capacitance at the input of the buffer amp; and
   a second capacitor coupling switch configured to, during the input phase of the conversion process in the first mode, couple the positive terminal of the second capacitor to the input capacitance at the input of the buffer amp.

8. The two-capacitor digital-to-analog converter circuit according to claim 1, wherein the buffer amp is an operational amplifier, the input capacitance at an input of the operational amplifier.

9. The two-capacitor digital-to-analog converter circuit according to claim 8, wherein capacitance compensation circuit includes a transistor configured to replicate the input capacitance of the operational amplifier.

10. The two-capacitor digital-to-analog converter circuit according to claim 8, wherein the operational amplifier is configured for unity gain and rail-to-rail operation.

11. The two-capacitor digital-to-analog converter circuit according to claim 1, further comprising a sample-and-hold capacitor coupled to an output of the buffer amp.

12. The two-capacitor digital-to-analog converter circuit according to claim 11, further comprising a first reset switch configured to discharge the first capacitor after the conversion process, a second reset switched configured to discharge the second capacitor after the conversion process, and a sample-and-hold reset switch configured to discharge the sample-and-hold capacitor after the conversion process.

13. A method for digital-to-analog conversion, the method comprising:
   selecting a mode condition for an active bit of a digital word;
   determining a first mode or a second mode for the active bit based on a value of the active bit and the selected mode condition;
   executing an input phase to charge or discharge an averaging circuit including a first capacitor directly coupled between a first terminal of a redistribution switch and a ground and a second capacitor directly coupled between a second terminal of the redistribution switch and the ground, the input phase including:
      in a first mode, charging or discharging the first capacitor and a replica input capacitance according the value of the active bit, and
      in a second mode, charging or discharging the second capacitor and the replica input capacitance according to the value of the active bit; and
   executing an average phase, the average phase including:
      controlling the redistribution switch to couple the first capacitor and the second capacitor together to generate an average voltage for the active bit, coupling the average voltage to a buffer amp having an input capacitance, and
coupling the replica input capacitance and the input capacitance together to generate an adjusted average voltage for the active bit at an input of the buffer amp.

14. The method for digital-to-analog conversion according to claim 13, further comprising:
repeating the selecting, the determining, the executing the input phase, and executing the average phase to obtain an adjusted average voltage for each bit of the digital word in a sequence.

15. The method for digital-to-analog conversion according to claim 14, further comprising:
outputting, from the buffer amp, the adjusted average voltage for a final bit of the digital word in the sequence as an output voltage, the output voltage corresponding to an analog conversion of the digital word.

16. The method for digital-to-analog conversion according to claim 15, further comprising:
discharging the first capacitor, the second capacitor, and the replica input capacitance;
receiving a new digital word;
repeating the selecting, the determining, the executing the input phase, and executing the average phase to obtain an adjusted average voltage for each bit of the new digital word in a sequence; and
outputting the adjusted average voltage for the final bit of the digital word in the sequence as the output voltage, the output voltage corresponding to an analog conversion of the new digital word.

17. The method for digital-to-analog conversion according to claim 13, wherein selecting a mode condition for the active bit comprises:
determining a bit position of the active bit, the bit position in a range from a least significant bit (LSB) to a most significant bit (MSB); and
selecting a first mode condition or a second mode condition based on the bit position, the first mode condition and the second mode condition alternating for each bit position in sequence from the LSB to the MSB.

18. The method for digital-to-analog conversion according to claim 17, wherein:
the first mode condition includes determining a first mode when a bit value of the active bit is zero and determining a second mode when the bit value of the active bit is one; and
the second mode condition includes determining a second mode when the bit value of the active bit is zero and determining a first mode when the bit value of the active bit is one.

19. The method for digital-to-analog conversion according to claim 13, wherein in the average phase, the coupling the average voltage to a buffer amp having an input capacitance includes:
in the first mode, coupling a positive terminal of the first capacitor and coupling a positive terminal of the second capacitor to the input of the buffer amp; and
in the second mode, coupling a positive terminal of the first capacitor and coupling a positive terminal of the second capacitor to the input of the buffer amp.

20. A system for digital to analog conversion, comprising:
a phase and mode controller configured to receive bits of a digital word and to output switching signals according to an input phase, an average phase, or an output phase of a conversion process, and according to a first mode or a second mode determined by each bit in the digital word received at an input to the system;
an averaging circuit including a first capacitor and a second capacitor, the averaging circuit configured to charge or discharge the first capacitor or the second capacitor during an input phase and configured to couple the first capacitor and the second capacitor together during an average phase in order to generate an average voltage;
an output circuit including an opamp configured for unity gain, the opamp having an input capacitance at an input to the opamp, the output circuit configured to generate an output voltage based on the average voltage received from the averaging circuit and configured to couple the output voltage to an output of the system during the output phase; and
a capacitance compensation circuit including a transistor configured to generate a replica input capacitance that is substantially equal to the input capacitance of the opamp, the capacitance compensation circuit configured to couple the replica input capacitance and the input capacitance of the opamp together during an average phase to adjust the average voltage to compensate for the input capacitance of the opamp.

21. The system for digital to analog conversion according to claim 20, wherein the phase and mode controller is configured to receive each bit of the digital word in sequence and to generate switching signals according to a first mode condition or a second mode condition, the first mode condition and the second mode condition alternating with each bit in the sequence.

* * * * *